United States Patent [19]
Yoshioka et al.

[11] Patent Number: 5,593,801
[45] Date of Patent: Jan. 14, 1997

[54] ATTENUATING TYPE PHASE SHIFTING MASK, METHOD OF MANUFACTURING THEREOF AND SEMICONDUCTOR DEVICE MANUFACTURED BY USING THE MASK

[75] Inventors: Nobuyuki Yoshioka; Junji Miyazaki, both of Hyogo, Japan

[73] Assignee: Mitsubishi Denki Kabushiki Kaisha, Tokyo, Japan

[21] Appl. No.: 462,723

[22] Filed: Jun. 5, 1995

Related U.S. Application Data

[63] Continuation-in-part of Ser. No. 194,445, Feb. 10, 1994, Pat. No. 5,429,897.

[30] Foreign Application Priority Data

Feb. 12, 1993 [JP] Japan ................................ 5-024198
Jan. 28, 1994 [JP] Japan ................................ 6-008430

[51] Int. Cl.$^6$ ........................................................ G03F 9/00
[52] U.S. Cl. ................................ 430/5; 430/31; 430/322; 430/394
[58] Field of Search ............................ 430/5, 322, 326, 430/394, 311, 313

[56] References Cited

U.S. PATENT DOCUMENTS 4,902,899  2/1990  Lin et al. ................................ 430/5
5,288,569  2/1994  Lin ........................................ 430/5

FOREIGN PATENT DOCUMENTS 57-62052    4/1982  Japan.
58-173744  10/1983  Japan.
4-136854    5/1992  Japan.
6-175347  12/1992  Japan.

*Primary Examiner*—S. Rosasco
*Attorney, Agent, or Firm*—Lowe, Price, LeBlanc & Becker

[57] ABSTRACT

An attenuating type phase shifting mask and semiconductor device manufactured by using the mask according to the present invention includes an attenuating type phase shifting pattern, and an attenuating type auxiliary phase shifting pattern having a transmitting portion and a phase shifter portion formed at a predetermined position at the periphery of attenuating type phase shifting pattern, wherein attenuating type auxiliary phase shifting pattern includes a pattern having a resolution smaller than a limit of resolution of an exposure apparatus. Whereby, exposure of the region around a normal exposure region is prevented, and also exposure of the region adjacent to the exposure region is prevented when conducting exposure successively with a substrate moved.

12 Claims, 17 Drawing Sheets

FIG.20 (A) PRIOR ART
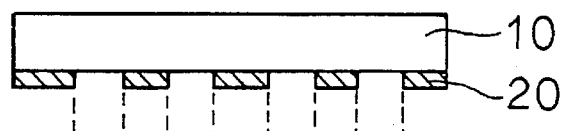
FIG.20 (B) PRIOR ART
ELECTRIC FIELD ON MASK
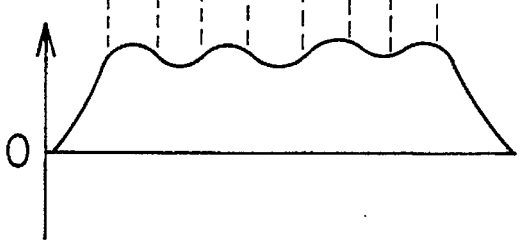
FIG.20 (C) PRIOR ART
LIGHT INTENSITY ON WAFER
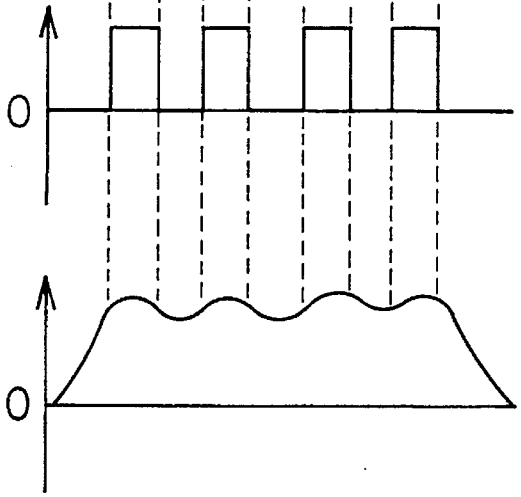
FIG.21 (A)
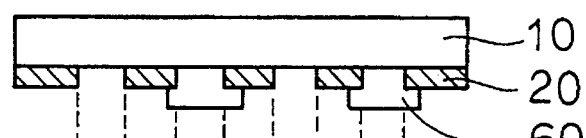
FIG.21 (B)
ELECTRIC FIELD ON MASK
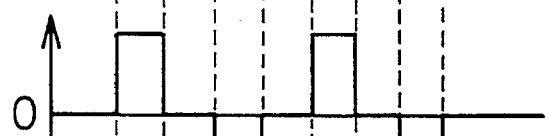
FIG.21 (C)
LIGHT INTENSITY ON WAFER
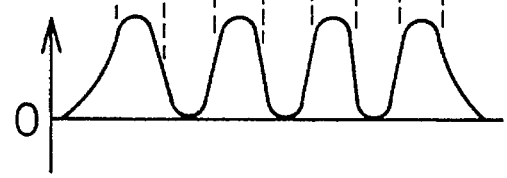

ELECTRIC FIELD ON MASK

LIGHT INTENSITY ON WAFER

THICKNESS ON RESIST FILM (AFTER DEVELOPMENT)

TRANSMITTANCE

▨ 30($I_0$)
▨ 31($I_0+I'$)
▨ 32($I_0+3\times I'$)

ATTENUATING TYPE PHASE SHIFTING MASK, METHOD OF MANUFACTURING THEREOF AND SEMICONDUCTOR DEVICE MANUFACTURED BY USING THE MASK

This application is a continuation-in-part of U.S. Ser. No. 08/194,445, now U.S. Pat. No. 5,429,897 filed on Feb. 10, 1994.

BACKGROUND OF THE INVENTION

1. Field of the Invention

The present invention relates to an attenuating type phase shifting mask, and more particularly, to a pattern of attenuating type phase shifting mask.

2. Description of the Background Art

Recently, high integration and miniaturization of the semiconductor integrated circuit has been developed rapidly. Accordingly, fine processing of the circuit pattern formed on the semiconductor substrate has been developed rapidly. Particularly, photolithography has been recognized broadly as basic technology in formation of the pattern. Although various developments and improvements have been carried out so far for photolithography, miniaturization of the pattern is still on going and the need for improvement of the resolution of the pattern has been more and more increased.

Generally, the limit of resolution R (nm) in photolithography utilizing the demagnification exposure method can be represented as follows:

$$R = k_1 \cdot \lambda/(NA)$$

where $\lambda$ is a wavelength (nm) of light used, NA is the numerical aperture of a lens and $k_1$ is a constant depending on resist process.

As can be seen from the above expression, values of $k_1$ and $\lambda$ should be decreased and the value of NA should increased in order to improve the limit of resolution. In other words, the constant depending on resist process should be decreased, while the wavelength should be shortened and NA should be increased. However, it is difficult technically to improve the light source and lenses, and by shortening the wavelength and increasing NA, the depth of focus $\delta$ ($\delta = k_2 \cdot \lambda/(NA)^2$) of light becomes shallower causing decrease of the resolution.

Referring to FIGS. 20(A), 20(B), and 20(C), a cross section of the mask, an electric field of exposure light on the mask and intensity of exposure light on a wafer when a conventional photomask is utilized will be described.

Referring to FIG. 20(A), a cross sectional structure of the photomask will be described. A metal mask pattern 20 made of chromium or the like is formed on a quartz glass substrate 10. Referring to FIG. 20(B), the electric field of exposure light on the photomask matches the mask pattern. As to the intensity of exposure light on the wafer, however, it is noted as shown in FIG. 20(C) that especially when the fine pattern is utilized, beams of the light transmitted through the mask intensity with each other at adjacent images where those beams of light overlap with each other due to diffraction and interference of light. Consequently, the difference of the light intensity on the wafer is reduced resulting in decreased resolution.

In order to solve the above-mentioned problem, the phase shifting exposure method utilizing a phase shifting mask has been proposed in, for example, Japanese Patent Laying-Open Nos. 57-62052 and 58-173744.

Referring to FIGS. 21(A), 21(B) and 21(C), the phase shifting exposure method utilizing the phase shifting mask disclosed in Japanese Patent Laying-Open No. 58-173744 will be described.

FIG. 21(A) shows a cross section of the phase shifting mask. FIG. 21(B) shows the electric field of exposure light on the photomask. FIG. 21(C) shows the light intensity of exposure light on the wafer.

Referring to FIG. 21(A), the phase shifting mask includes a chromium mask pattern 20 formed on a glass substrate, and at every other aperture of mask pattern 20, a phase shifter 60 formed by a transparent insulating film such as silicon oxide film is provided.

Referring to FIG. 21(B), as to the electric field of exposure light on the photomask provided by the light transmitted through the phase shifting mask, phases of the exposure light are alternately reversed by 180°. In other words, beams of light are canceled with each other at adjacent pattern images where beams of light overlap with each other due to interference. Accordingly, as shown in FIG. 21(C), the resolution of pattern images can be improved, because of the sufficient difference of the intensity of exposure light on the wafer.

Although the above-mentioned phase shifting mask is very effective for a periodic pattern such as lines and spaces, the mask cannot be set appropriately in case of a complicated pattern because arrangement or the like of phase shifters is very difficult.

In order to solve the above-mentioned problem, an attenuating type phase shifting mask is disclosed in, for example. "JJAP Series 5 Proceedings of 1991 International Micro Process Conference, pp. 3–9" and in Japanese Patent Laying-Open No. 4-136854. The attenuating type has shifting mask disclosed in the Japanese Patent Laying-Open No. 4-136854 will be described below.

FIG. 22(A) shows a cross section of the above-mentioned attenuating type phase shifting mask 500. FIG. 22(B) shows the electric field of exposure light on the mask. FIG. 22(C) shows the intensity of exposure light on the wafer.

Referring to FIG. 22(A), phase shifting mask 500 includes a phase shifting pattern 300 which is a predetermined exposure pattern, including a quartz substrate 10 through which the exposure light is transmitted, a transmitting portion 100 formed on a main surface of quartz substrate 10 for exposing the main surface of quartz substrate 10, and a phase shifter 200 for shifting the phase of the exposure light transmitting therethrough by 180° relative to the phase of the exposure light transmitting through said transmitting portion 100.

Phase shifter 200 is an absorption type shifter film of a double-layered structure including a chromium layer 20 having 5–20% transmittance of exposure light, and a shifter layer 30 for converting the phase of the exposure light transmitting through transmitting portion 100 by 180°.

The transmittance of exposure light of phase shifter 200 is set to 5–25%, which is appropriate for lithography, since the thickness of the resist film after development is adjusted according to the transmittance as shown in FIG. 23.

The electric field on the mask of the exposure light transmitting through the phase shifting mask having the above-mentioned structure is as shown in FIG. 22(B). As to the intensity of the exposure light on the wafer, the light intensity at the edge of the exposure pattern is inevitably 0 as shown in FIG. 22(C), since the phase of the exposure light is reversed at the edge of the exposure pattern. Consequently, there is provided sufficient difference between the light intensity corresponding to the transmitting portion 100 and that corresponding to the phase shifter 200, so that the resolution can be improved.

The above-mentioned conventional technology, however, has the following disadvantages.

FIG. 24(A) shows positions of the attenuating type phase shifting mask placed in the exposure apparatus and a blind 70 for determining the exposure region of the exposure apparatus. FIG. 24(B) shows the electric field of the exposure light directly under the attenuating type phase shifting mask and blind 70. FIG. 24(C) shows the light intensity on the exposed material of the light transmitted through the attenuating type phase shifting mask and blind 70. FIG. 24(D) shows the region exposed by the light transmitted through the attenuating type phase shifting mask and blind 70.

Referring to FIG. 24(A), the region other than a chip pattern forming region (Lc) of the attenuating type shifting mask is covered with absorption type shifter film 20 in which pattern processing is not conducted. In a demagnification projection, exposure apparatus blind 70 which interrupts the light for determining the exposure region is provided at a prescribed position under the attenuating type phase shifting mask.

The aperture of blind 70 may have any width so long as it allows exposure of the chip pattern region, and therefore the width may be the same as the chip pattern region (Lc). However, since the position of blind 70 is controlled by the distance of about 1000 μm (about 1 mm) and blind 70 is not positioned on the same plane of focus as the attenuating type phase shifting mask, the edge portion of blind 70 is not well focused out of focus. Thus, as shown in FIG. 24(A), the width of aperture of blind 70 (Lb) is set to about 1000 μm wider than the chip pattern region (Lc) so that blind 70 does not overlap the chip pattern region (Lc).

Accordingly, in an ordinary photomask utilizing an interrupting film of chromium, for example, on the chip pattern, only 1/1000 of the light can be transmitted through chromium at most, so that the light passing through the gap between the chip pattern region and blind 70 will not expose the resist film on the semiconductor wafer.

In case of the attenuating type phase shifting mask, however, 5–20% of the exposure light passes through the gap between the chip pattern region and blind 70 as indicated by portion A of FIG. 24(B) because the transmittance of the absorption type shifter film serving as a material of the chip pattern is about 5–20%. Consequently, referring to FIG. 24(C), a region having the light intensity of I' which is 5–20% of the transmitted light $I_0$ results between the chip pattern region $L_c$ and blind 70 as can be seen from the distribution of intensity of the light transmitted through the attenuating type phase shifting mask and through blind 70. Thus, referring to FIG. 24(D), there is formed a region 50 having the light intensity (I') and having the width of Ld of 5–20% around chip pattern region 30 (Lc×Lc).

When patterns of the attenuating type phase shifting mask are demagnified and transferred onto the semiconductor wafer utilizing the demagnification projection exposure apparatus having the above-described structure, exposure proceeds successively at a pitch of Lc which is the size of the chip pattern. FIG. 25 shows the exposed regions on the semiconductor wafer when the wafer is exposed using the attenuating type phase shifting mask having the chip pattern of the size (Lc×Lc), utilizing the demagnification projection exposure apparatus.

In this case, since exposure proceeds at a pitch of Lc longitudinally and transversely, there is a region 50 having the light intensity (I') of 5–20% (I') as described above around the chip pattern provided by one exposure shot. This region 50 overlaps an adjacent region provided by another exposure shot. As exposure is repeated successively, region 50 is exposed overlapped with adjacent three regions 50 at each corner of the exposure region. As a result, the exposed region comes to include region 31 each of which is exposed with the light having the appropriate intensity $I_0$ plus the intensity I', which is 5–20% of $I_0$, and region 32 each of which is exposed with the light having the intensity $I_0$ plus three times the intensity I'.

In regions 31 and 32 which are exposed in such overlapped manner, when a positive resist film, for example, is exposed, the thickness of the resist film decreases after development. On the other hand, when the absorption type shifter film having a high transmittance is used, the resist film is completely exposed so that the resist film is lost by development.

SUMMARY OF THE INVENTION

An object of the present invention is to provide an attenuating type phase shifting mask and method of manufacturing thereof having such patterns that prevent exposure of the region around a normal exposure region, and more specifically prevent exposure of regions adjacent to the exposure region when exposure is carried out successively with the mask moved and to provide a semiconductor device formed by using the mask.

In order to achieve the above object, the attenuating type phase shifting mask and method of manufacturing thereof according to one aspect of the present invention includes an attenuating type phase shifting pattern formed at a predetermined position on a photomask substrate; and an attenuating type auxiliary phase shifting pattern having a transmitting portion and a phase shifter formed on a predetermined position at the periphery of said attenuating type phase shifting pattern. Also, the attenuating type auxiliary phase shifting pattern includes patterns which are smaller than the limit of resolution of the exposure apparatus and the transmitting portion and the phase shifter are arranged irregularity.

According to the attenuating type phase shifting mask and method of manufacturing thereof, images cannot be formed on the semiconductor wafer by the light transmitted through the attenuating type auxiliary phase shifting pattern because the pattern is smaller than the limit of resolution of the exposure apparatus. Further, since beams of the light transmitted through the transmitting portion and beams of the light transmitted through the phase shifter overlap with each other and are in reverse phases, those beams cancel with each other due to interference, so that the light intensity on the semiconductor wafer can be reduced. Further, as the transmitting portion and the phase shifter portion are arranged irregularly, the light (stray light) scattering at the phase shifter portion come to have irregular directions, and therefore degradation of the transferred pattern caused by light scattering a specific direction can be reduced.

According to the present invention, values of the planar area ($S_O$) of the transmitting portion, the planar area ($S_H$) of the phase shifter, and transmittance T of the phase shifter are set such that the substantial light intensity on the exposed material resulting from light intensity on the exposed material of the light transmitting through the transmitting portion and the light intensity on the exposed material of the light transmitting through the phase shifter overlapped and canceled with each other is not more than 3% of the light intensity before transmitting through said transmitting portion and said phase shifter.

Accordingly, the light intensity on the semiconductor wafer can be controlled by adjusting the intensity of light transmitting through the phase shifter and the intensity of light transmitting through the transmitting portion.

More preferably, according to the present invention, in the attenuating type auxiliary phase shifting pattern, the ratio of the planar area ($S_O$) of the transmitting portion to the planar area ($S_H$) of the phase shifter, which is represented by $S_O/S_H$, is set appropriately equal to $\sqrt{T}$ of the transmittance (T) of the phase shifter.

According to the attenuating type phase shifting mask of the present invention, since the ratio $S_H/S_O$ is set as described above, the light intensity on the semiconductor wafer can be set not more than 3% of the light intensity before transmitting through the transmitting portion and the phase shifter.

More preferably, according to the present invention, the attenuating type auxiliary phase shifting pattern is provided at the entire periphery of the attenuating type phase shifting pattern.

Accordingly, even when a plurality of portions on the semiconductor wafer are to be exposed utilizing the attenuating type phase shifting mask, exposure can be carried out without exposing other regions.

More preferably, according to the present invention, the attenuating type phase shifting pattern is rectangular and the attenuating type auxiliary phase shifting pattern is provided in the vicinity of each of four corners of the attenuating type phase shifting pattern.

Therefore, when the semiconductor wafer is to be exposed successively in order utilizing the attenuating type phase shifting pattern, satisfactory exposure can be carried out because no region is exposed more than once by the light transmitting through the periphery of the attenuating type phase shifting pattern.

More preferably, according to the present invention, the planar shape of the transmitting portion of the attenuating type auxiliary phase shifting pattern is rectangular.

Since the phase shifter is provided integrally on the photomask substrate and the transmitting portion is in the form of aperture, the phase shifting photomask can be adhered on the substrate so that the attenuating type phase shifting mask having a highly reliable structure can be provided.

More preferably, according to the present invention, the transmitting portions and the phase shifters of the attenuating type auxiliary phase shifting pattern are linear and arranged alternately.

Thus, the pattern can be lines and spaces so as to reduce the cost of the attenuating type phase shifting pattern.

Further, in order to achieve the above object, the semiconductor device formed by using the attenuating type phase shifting mask according to the present invention is manufactured by using the attenuating type phase shifting mask including an attenuating type phase shifting pattern formed at a predetermined position on a photomask substrate, and an attenuating type auxiliary phase shifting pattern having a transmitting portion and a phase shifter formed on a predetermined position at the periphery of said attenuating type phase shifting pattern, with the attenuating type auxiliary phase shifting pattern having patterns which are smaller than the limit of resolution of the exposure apparatus and the transmitting portion and the phase shifter portion being arranged irregularly.

Accordingly, in the semiconductor device manufactured by using the attenuating type phase shifting mask, the light (stray light) scattered at the phase shifter portion comes to have random directions, and degradation of transferred patterns caused by light scattering in a specific direction can be reduced, whereby even fine patterns can be manufactured with high quality and production yield can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 20(A) is a cross sectional view showing a structure of a conventional photomask, FIG. 20(B) shows the electric field of the exposure light on the mask, and FIG. 20(C) shows the intensity of the exposure light on the wafer.

FIG. 21(A) is a cross sectional view showing a structure of a conventional phase shifting mask, FIG. 21(B) shows the electric field of the exposure light on the mask, and FIG. 21(C) shows the intensity of the exposure light on the wafer.

DESCRIPTION OF THE PREFERRED EMBODIMENTS

Figure 1:
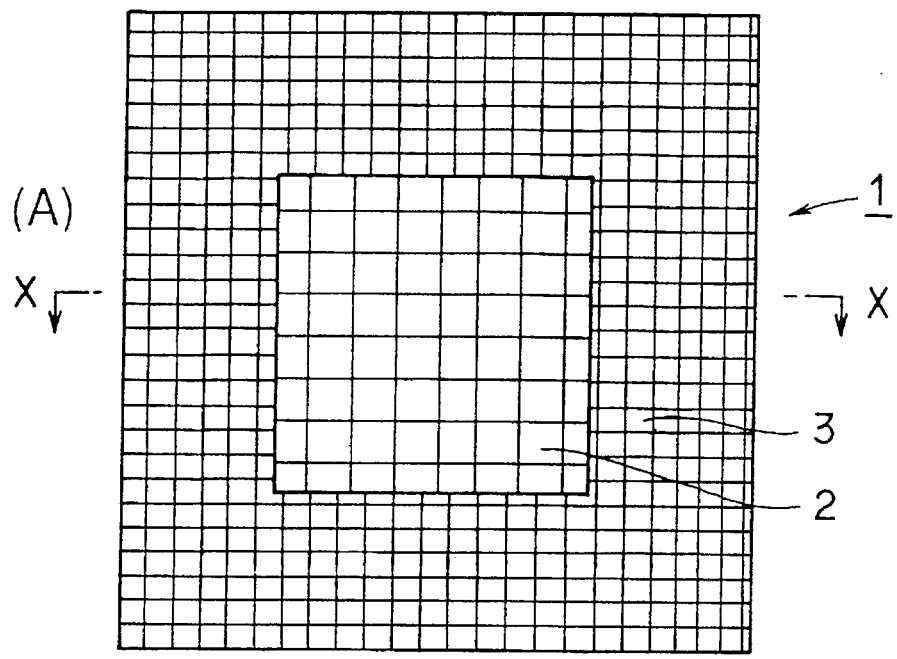
FIG. 1(A) shows an attenuating type phase shifting mask according to the first embodiment viewed from the pattern formation surface.
FIG. 1(B) is a cross sectional view taken along a line X—X of FIG. 1(A)
Figure 1:
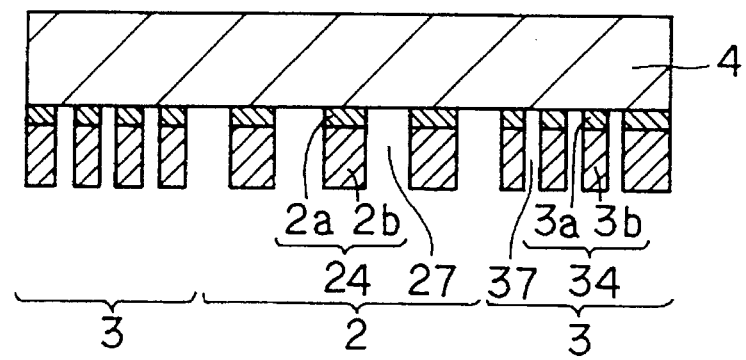

The first embodiment of an attenuating type phase shifting mask according to the present invention will be described below.

FIG. 1(A) shows an attenuating type phase shifting mask 1 of the present embodiment when viewed from pattern formation side. FIG. 1(B) is a cross sectional view along line X—X of FIG. 1(A).

In attenuating type phase shifting mask 1, an attenuating type phase shifting pattern 2, which is a square region, is formed approximately at the center on a photomask substrate 4. An attenuating type auxiliary phase shifting pattern 3 is formed at the entire periphery of the attenuating type phase shifting pattern 2.

An attenuating type phase shifting pattern 2 is formed by a phase shifter portion 24 and a transmitting portion 27. Phase shifter portion 24 is formed by chromium film 2a having a transmittance of 5–20% and SiO$_2$ film 2b providing phase shifting of 180°.

Figure 2:
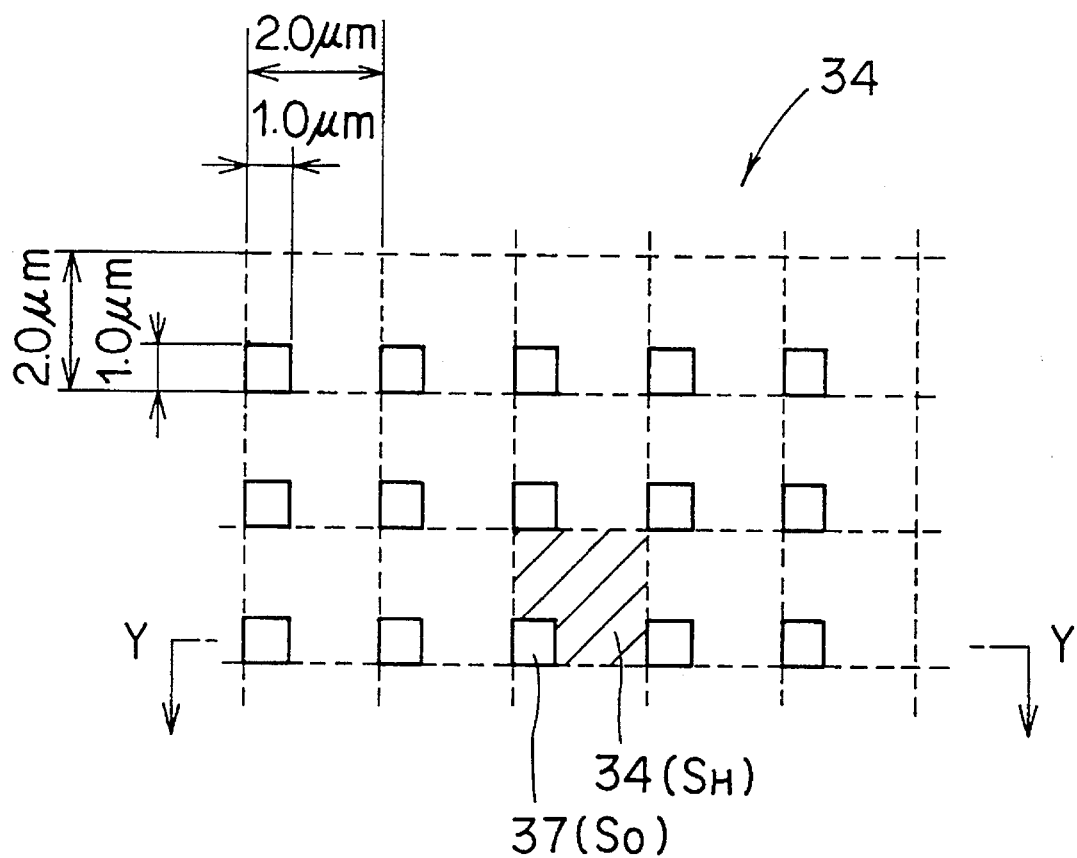
FIG. 2 shows patterns of an attenuating type auxiliary phase shifting pattern of the first embodiment.

Referring to FIG. 2, an attenuating type auxiliary phase shifting pattern 3 will be described below. Attenuating type auxiliary phase shifting pattern 3 is formed by processing a phase shifter portion 34 formed by chromium film 3a having a transmittance of 5–20% and SiO$_2$ film 3b providing phase shifting of 180° into a pattern of a size smaller than the limit of resolution of the exposure apparatus. In FIG. 2, a planar area of phase shifter portion 34 is represented by $S_H$ and a planar area of a square transmitting portion 37 is represented by $S_O$.

Figure 3A:
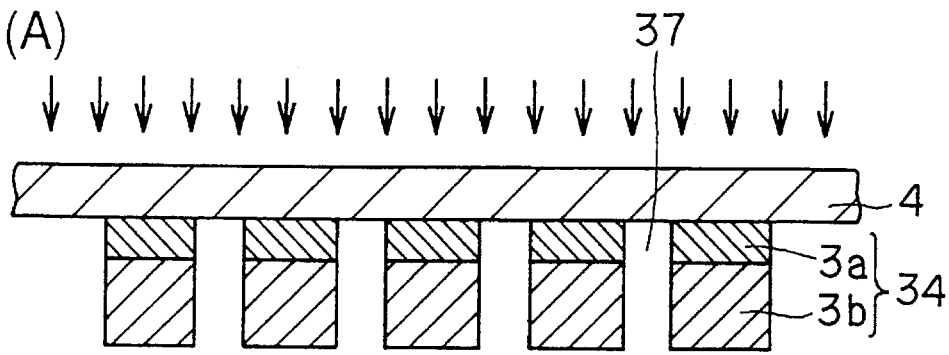
FIG. 3(A) is an enlarged cross sectional view of the attenuating type auxiliary phase shifting pattern.
Figure 3B:
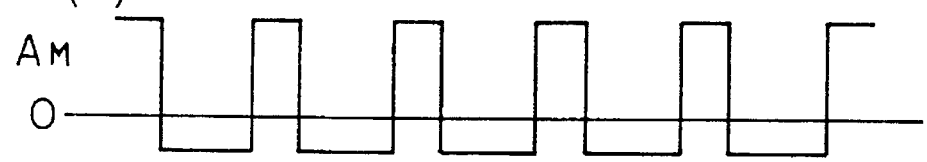
FIG. 3(B) is a cross sectional view showing an electric field of the exposure light directly under the photomask substrate.
Figure 3C:
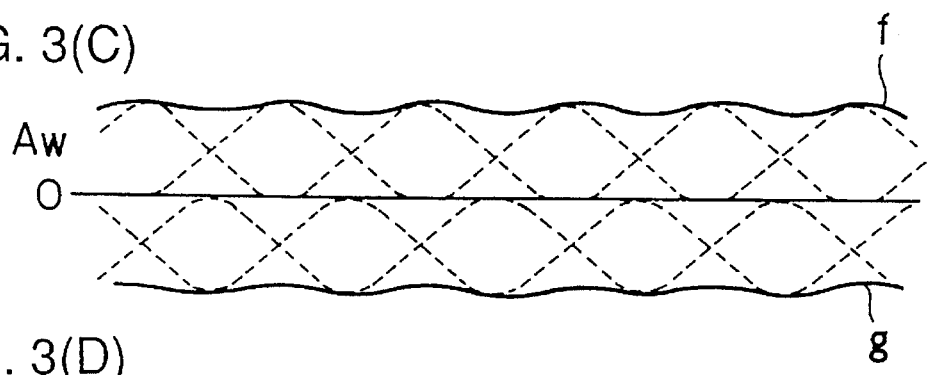
FIG. 3(C) shows the electric field of the exposure light on the semiconductor wafer.

Referring to FIGS. 3(A) to 3(C), the light intensity on the semiconductor wafer of the exposure light transmitting through attenuating type auxiliary phase shifting pattern 3 will be described.

Referring to FIG. 3(A), phase shifter 34 and transmitting portion 37 are formed into predetermined shapes on photomask substrate 4 with the planar area of the phase shifter 34 represented by ($S_H$) and the planar area of transmitting portion 37 represented by ($S_O$).

Referring to FIG. 3(B), the electric field of the exposure light directly under photomask substrate 4 has the transmittance and the phase thereof converted according to patterns formed. As to the electric field on the exposed material of the exposure light transmitted through transmitting portion 37 and phase shifter 34, when optical images are projected through a demagnification lens, as shown in FIG. 3(C), the electric field on the exposed material of the exposure light transmitted through transmitting portion 37 has an appropriately constant value as shown by curve f, while the electric field on the exposed material of the exposure light transmitted through phase shifter 34 also has an approximately constant value as shown by curve g similarly to curve f, because the patterns are below the limit of resolution and images are overlapped with each other.

Figure 3D:
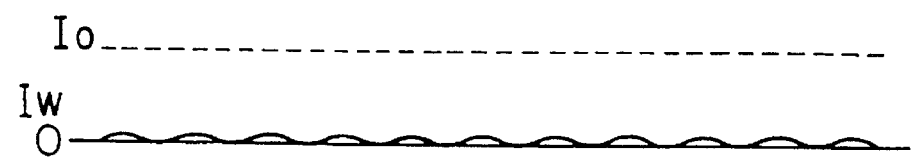
FIG. 3(D) shows the intensity of the exposure light on the semiconductor wafer.

Thus, as shown in FIG. 3(D), the intensity of the exposure light on the exposed material is reduced, since electric fields shown by curve f and curve g are canceled with each other.

If absolute values of electric fields shown by curve f and curve g are equal, the light intensity on the exposed material can be minimized.

The magnitude of electric fields shown by curve f and curve g can be determined respectively according to the relationship between planar area ($S_H$) of phase shifter 34, planar area ($S_O$) of transmitting portion 37, and transmittance (T) of phase shifter 34.

Figure 4:
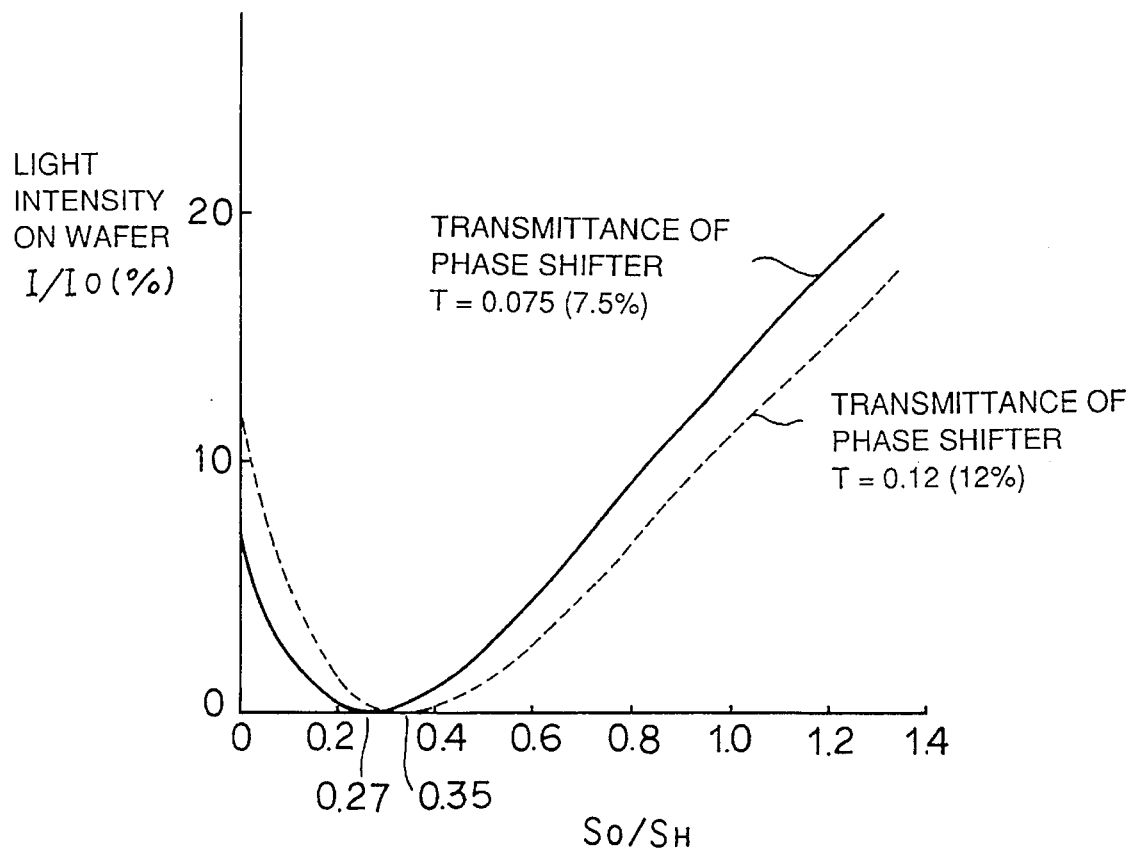
FIG. 4 is a graph showing the relationship between the ratio of the planar area ($S_O$) of the transmitting portion to the planar area ($S_H$) of the phase shifter ($S_H$) and the light intensity ratio on the wafer.

In FIG. 4, abscissa indicates the $S_O/S_H$ ratio, and ordinate indicates the ratio $I/I_O$ (%) of the light intensity on the wafer.

The solid line represents the case when the transmittance of the phase shifter film is T=0.075 (7.5%), while the dotted line represents the case when the transmittance of the phase shifter film is T=0.12 (12%)

As can be seen from FIG. 4, the minimum value is obtained with $S_O/S_H$=0.25 when the phase shifting film having the transmittance T=7.5% is used, while the minimum value is obtained with $S_O/S_H$=0.35 when the phase shifter film having the transmittance T=12.0% is used, and the $I/I_O$ ratio becomes not more than 0.1% in either case.

Accordingly, in order to attain the ratio $I/I_O$ of not more than 3%, the relationship between planar area ($S_O$) of phase shifter 34, planar area ($S_H$) of the transmitting portion 37, and transmittance (T) of the phase shifter 34 should satisfy the following relationship:

$$S_O/S_H = \sqrt{T} \quad (2)$$

The acceptable range of the value $\sqrt{T}$ will be described.

Figure 5:
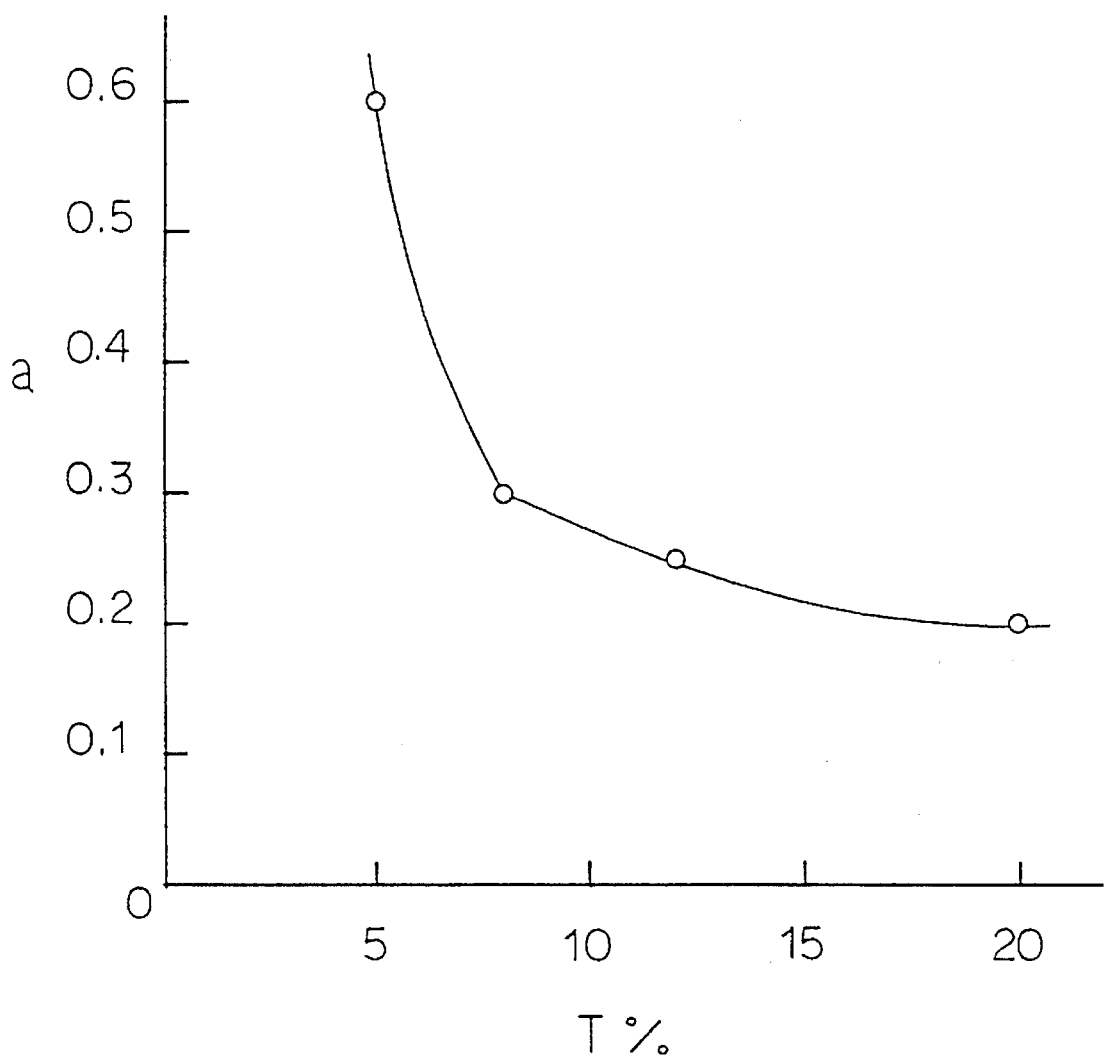
FIG. 5 is a graph showing the relationship between transmittance of the phase shifter and the value of a representing the range of the planar area of the phase shifter.

FIG. 5 is a graph in which abscissa indicates transmittance T % of the phase shifter 34, and ordinate indicates the value a when the range of planar area ($S_O$) of phase shifter 34 is set to $(1-a)S_O \sim (1+a)S_O$.

Since there is a correlation between $S_O$ and $S_H$, the value of $S_s$ changes according to the value of $S_O$.

Consequently, the ratio $S_O/S_H$ can be represented by the following equations;

$$\frac{(1+a) \cdot S_O}{S_H - a \cdot S_O} = \frac{S_O + a \cdot S_O}{S_H - a \cdot S_O} = \quad (3)$$

$$\frac{\dfrac{S_O}{S_H} + a \dfrac{S_O}{S_H}}{1 - a \dfrac{S_O}{S_H}} = \frac{1+a}{1 - a\sqrt{T}} \cdot \sqrt{T}$$

$$\frac{(1-a) \cdot S_O}{S_H + a \cdot S_O} = \frac{S_O - a \cdot S_O}{S_H + a \cdot S_O} =$$

-continued $$\frac{\frac{S_O}{S_H} - a\frac{S_O}{S_H}}{1 + a\frac{S_O}{S_H}} = \frac{1-a}{1+a\sqrt{T}} \cdot \sqrt{T}$$

Therefore, it holds:

$$\frac{1-a}{1+a\sqrt{T}} \cdot \sqrt{T} \le \frac{S_O}{S_H} \le \frac{1+a}{1-a\sqrt{T}} \cdot \sqrt{T} \quad (4)$$

Next attenuating type auxiliary phase shifting pattern 3 will be described in case, for example, where i-line (λ=365 nm) is used as the light source and the demagnification exposure apparatus having 1/5 of demagnification ratio of the lens with NA=0.54 and $k_1$ =0.4 is used.

Referring to FIG. 2, square patterns are formed at a pitch of 2.0 μm with the size of an aperture of transmitting portion 37 being 1.0 μm×1.0 μm. The attenuating type auxiliary phase shifting pattern 3 is formed to have the width of 1500 μm at the entire periphery of the attenuating type phase shifting pattern 2, as shown in FIG. 1.

Phase shifter 34 has a two-layered structure including a $SiO_2$ film 2b controlling the phase and a Cr film 2a controlling the transmittance, of which phase shifting angle is set to 180° and the transmittance is set to 12%.

The limit of resolution of the above-mentioned demagnification projection exposure apparatus is set to 0.4 μm on the semiconductor wafer, while the limit is set to 0.2 μm on the photomask which is five times that on the semiconductor wafer. Thus, attenuating type auxiliary phase shifting pattern 3 is sufficiently smaller than the limit of resolution.

Under the above-mentioned conditions, $S_O/S_H$ equals 0.33, and a equals 0.25 when transmittance is 12% according to FIG. 5, so that when we substitute these values, equation (4) would be as follows:

$$0.23910 \ge S_O/S_H \ge 0.474$$

Since the value of √T equals 0.346, the relationship of equation (4) can be satisfied and the relationship of equation (2) can be almost satisfied.

Exposure utilizing attenuating type phase shifting mask 1 having the above-described structure will be described below.

Figure 6A:
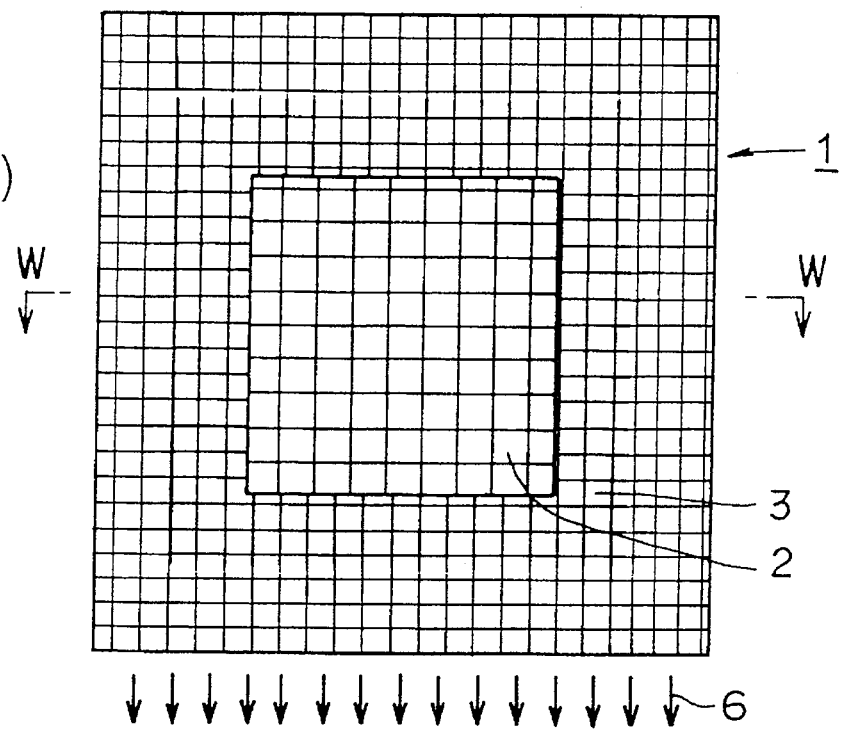
FIG. 6(A) shows the attenuating type phase shifting mask of the first embodiment when viewed from the pattern formation surface.

FIG. 6(a) shows an attenuating type phase shifting mask 1 wherein an attenuating type auxiliary phase shifting pattern 3 satisfying the above conditions is formed at the entire periphery of attenuating type phase shifting pattern 2.

Figure 6B:
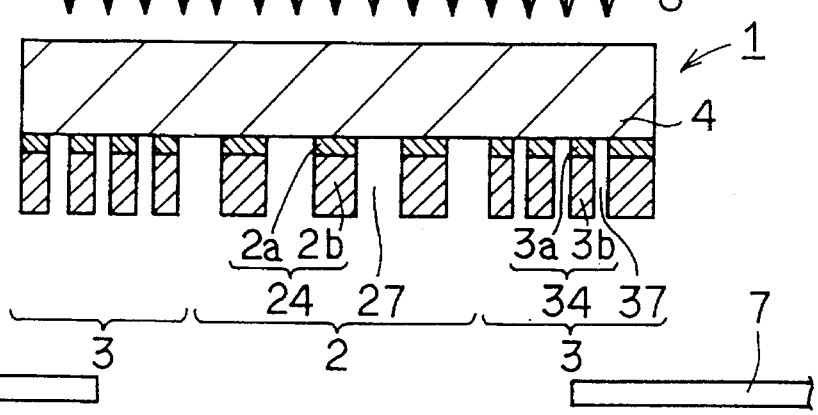
FIG. 6(B) is a cross sectional view showing positions of the attenuating type phase shifting mask and a blind.
Figure 6C:
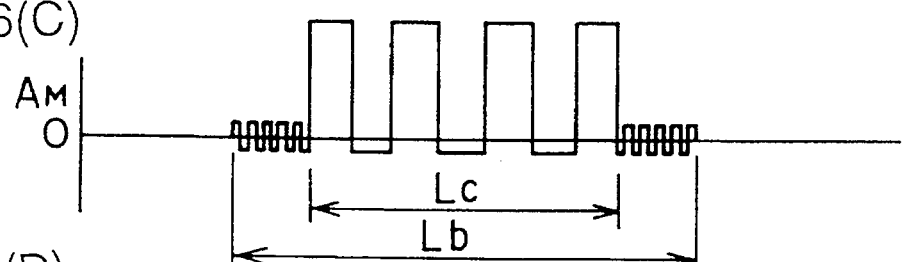
FIG. 6(C) shows the electric field of the exposure light directly under the photomask substrate.
Figure 6D:
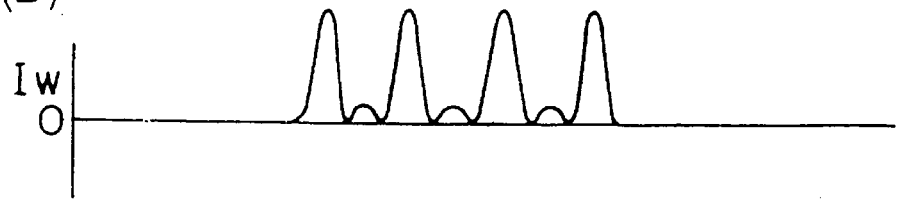
FIG. 6(D) shows the light intensity on the semiconductor wafer.

FIG. 6(b) is a sectional view showing the position of attenuating type phase shifting mask 1 relative to a blind 7 of the exposure apparatus. FIG. 6(c) shows an electric field of the light directly under a photomask substrate. FIG. 6(d) is a graph showing the light intensity on the exposed material.

Beams of light transmitted through attenuating type auxiliary phase shifting pattern 3 do not form any images on the semiconductor wafer since the pattern is smaller than the limit of resolution, and at the same time, beams of light transmitted through the transmitting portion and beams of light transmitted through the phase shifter are canceled with each other resulting in the light intensity of not more than 3% of the light intensity before transmitting through the pattern, so that regions other than the exposure region are not exposed.

Thus, exposure can be carried out satisfactorily even in the case of successive exposure as before.

Figure 7:
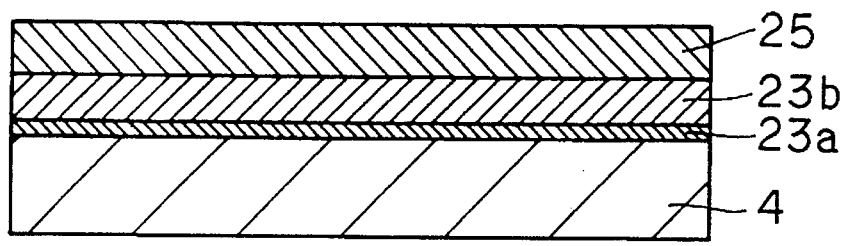
FIGS. 7–11 are sectional views showing the first through fifth steps of manufacturing the attenuating type auxiliary phase shifting pattern according to the first embodiment of the invention.

Next, description will be made on a method of manufacturing the attenuating type phase shifting mask with referring to FIGS. 7–11. Referring to FIG. 7, chromium film 23a having a thickness of about 200 Å is formed on a quartz glass substrate 4. $SiO_2$ film 23a having a thickness of about 4000 Å is formed on chromium film 23a. An electron beam resist film (e.g. ZEP-810) 25 having a thickness of about 5000 Å is formed on $SiO_2$ film 23b.

Figure 8:
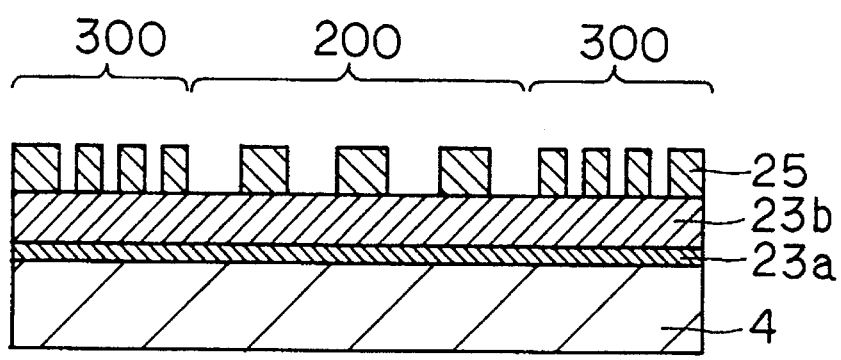

Referring to FIG. 8, EB (Electron Beam) lithography is conducted on electron beam resist film 25 using a variable shaped electron beam exposure apparatus (e.g. NEC JBX-7000MV, 6AIII). EB lithography is executed as below in order to obtain an accurate attenuating type auxiliary phase shifting pattern.

More particularly, an exposure pattern of the attenuating type auxiliary phase shifting pattern is set to have dimensions smaller than those of the finished pattern, or a dosage of electron beams directed to the attenuating type auxiliary phase shifting pattern region is made greater than that directed to the attenuating type phase shifting pattern region, or both steps are carried out. For instance, attenuating type phase shifting pattern region 200 is exposed at a dosage of electron beams within the range of 8–10 μc/cm². In order to obtain apertures each having dimensions of 1 μm×1 μm □ at intervals of 2 μm through exposure of attenuating type auxiliary phase shifting pattern region 300 by EB lithography, an exposure pattern should have dimensions of 0.8 μm×0.8 μm □. Electron beams are directed at a dosage of 10–12 μc/cm² in an overdosed manner, whereby apertures having dimensions of 1 μm×1 μm □ can be obtained. Electron beam resist film 25 is developed after EB lithography is completed, and then a predetermined pattern is obtained.

Figure 9:
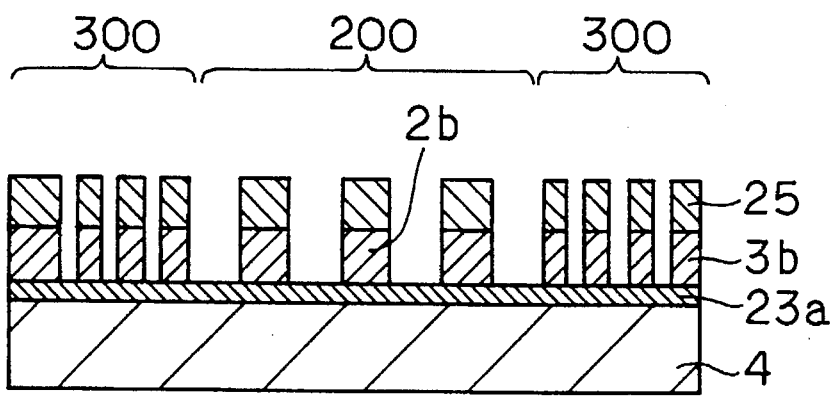

Referring to FIG. 9, $SiO_2$ film 23b is etched using electron beam resist film 25 having the predetermined pattern formed thereon as a mask. Etching is conducted with a magnetron RIE apparatus using $CHF_3+O_2$ ($CHF_3$; $O_2$=90:10) as an etching gas with an RF power of 200 W, a magnetic field of 100G, and a gas pressure of 50 m torr. Whereby a $SiO_2$ film 2b having a predetermined shape of pattern is formed at attenuating type phase shifting pattern region 200, and a $SiO_2$ film 3b having a predetermined shape is formed at attenuating type auxiliary phase shifting pattern region 300.

Figure 10:
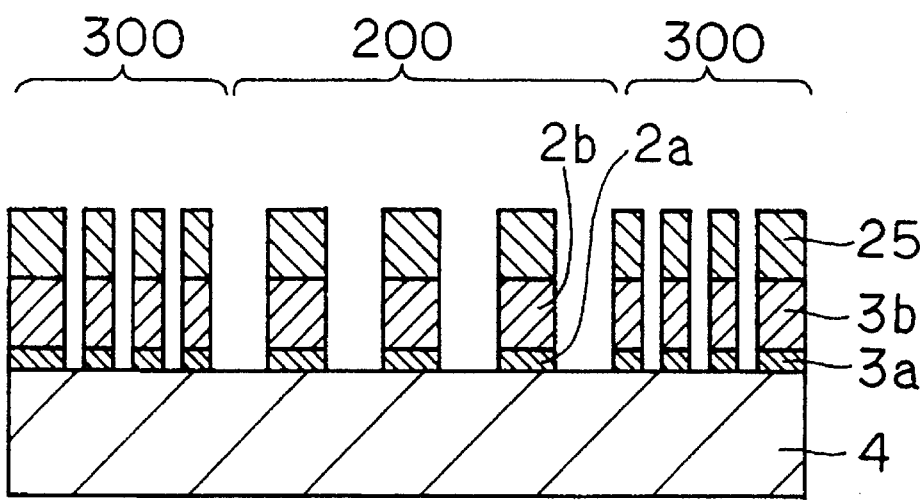
Figure 11:
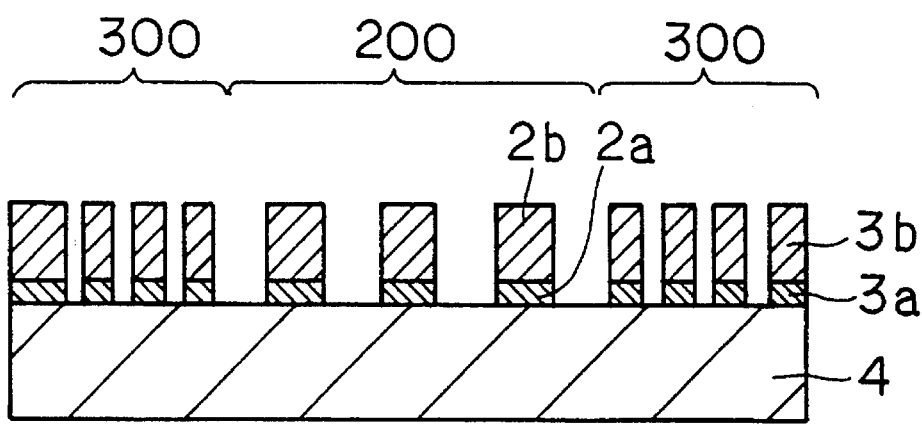

Referring to FIG. 10, chromium film 23a is etched using again electron beam resist film 25. As in the case of above-mentioned $SiO_2$ film, etching is conducted with the magnetron RIE apparatus using $Cl_2+O_2$($Cl_2$:$O_2$=80:20) with an RF power of 100 W, a magnetic field of 100G and gas pressure of 50 m torr. Thus, chromium film 2a of a predetermined shape is formed at attenuating type phase shifting pattern region 200, and chromium film 3a of a predetermined shape is formed at attenuating type auxiliary phase shifting pattern region 300. Next, referring to FIG. 11, electron beam resist film 25 is removed, and thus attenuating type phase shifting mask 1 according to the present embodiment is completed.

In this embodiment, although a two-layer structure of $SiO_2$ film for controlling phases and chromium film for controlling a transmittance is employed, a single layer film made of one kind of material selected from a group comprising chromium oxide, chromium nitride oxide, nitride carbide oxide of chromium, molybdenum silicide oxide, and nitride oxide of molybdenum silicide may be used to control the phase and transmittance to predetermined values. In this case, chromium oxide and the like can be thinner to have a film thickness of about 1200–1600 Å compared with the above mentioned two-layer structure, thereby facilitating the formation of the phase shifting pattern.

The second embodiment according to the present invention will be described.

In the first embodiment, square patterns each having the size of 1.0 μm×1.0 μm have been described as patterns for the attenuating type auxiliary phase shifting pattern. In such a square patterns, the phase shifter film is provided integrally so that it has a superior adhesion to the photomask substrate. However, manufacturing the photomask, the electron beam lithography is time consuming since a large number of transmitting portions should be formed. Especially, the time taken for manufacturing becomes longer in the lithography system utilizing a variable shaped beam, since it depends on the shape of patterns.

Figure 12:
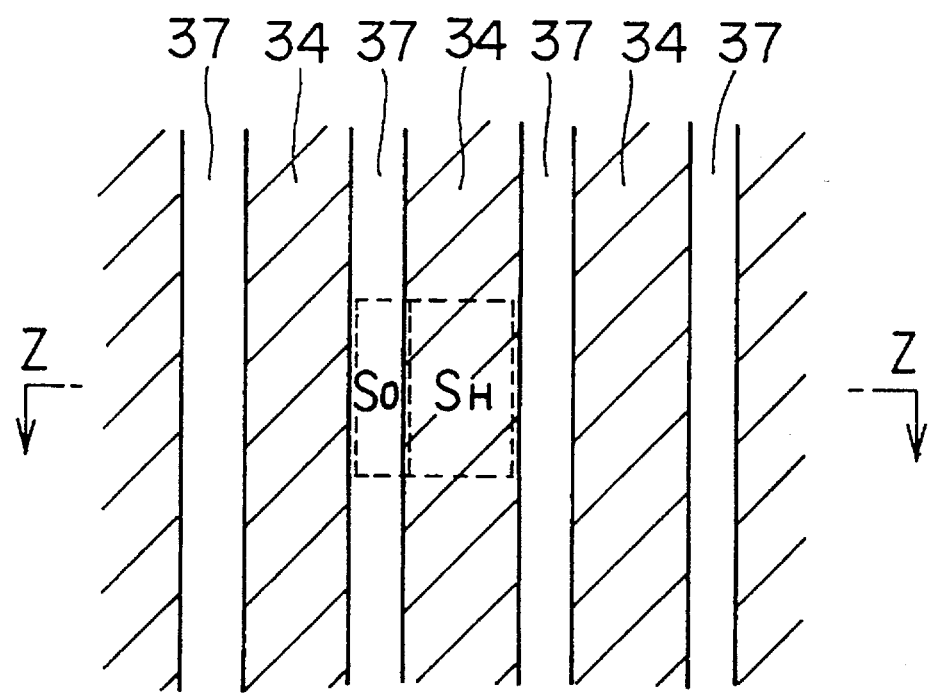
FIG. 12 shows patterns of an attenuating type auxiliary phase shifting pattern of the second embodiment.

In order to shorten the time taken for lithography, attenuating type auxiliary phase shifting pattern 3 is formed to have lines and spaces with transmitting portions 37 and phase shifters 34 being linear and arranged alternately as shown in FIG. 12. In this case, the pattern 3 is formed at the entire periphery of attenuating type phase shifting pattern 2 with the width of the transmitting portion being 0.5 μm, as in the first embodiment. The cross sectional view along line Z—Z of FIG. 12 is similar to the cross sectional view shown in FIG. 3(A).

The value of $S_O/S_H$ in the attenuating type phase shifting mask having the above-mentioned structure is 0.35 satisfying $\sqrt{T}=\sqrt{0.12} \approx 0.33$, so that equations (2) and (4) can be satisfied.

Therefore, the similar effect can be obtained as in the first embodiment by utilizing the attenuating type phase shifting mask according to the second embodiment.

An attenuating type phase shifting mask according to the third embodiment of the present invention will be described.

Figure 22:
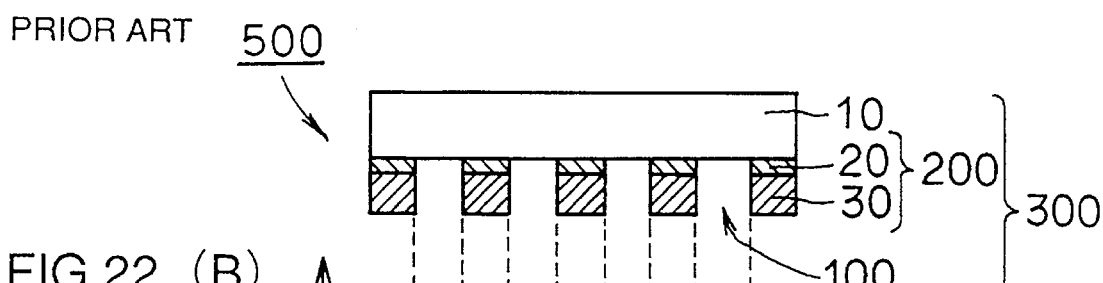
FIG. 22(A) shows a structure of a conventional attenuating type phase shifting mask.
FIG. 22(B) shows the electric field of the exposure light on the mask.
FIG. 22(C) shows the intensity of the exposure light-on the wafer.
Figure 22:
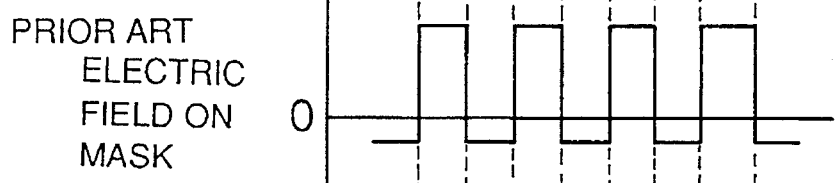
Figure 22:
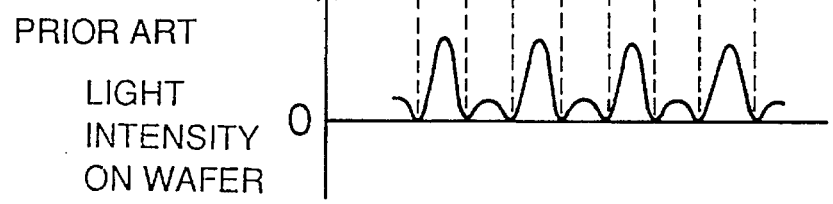
Figure 23:
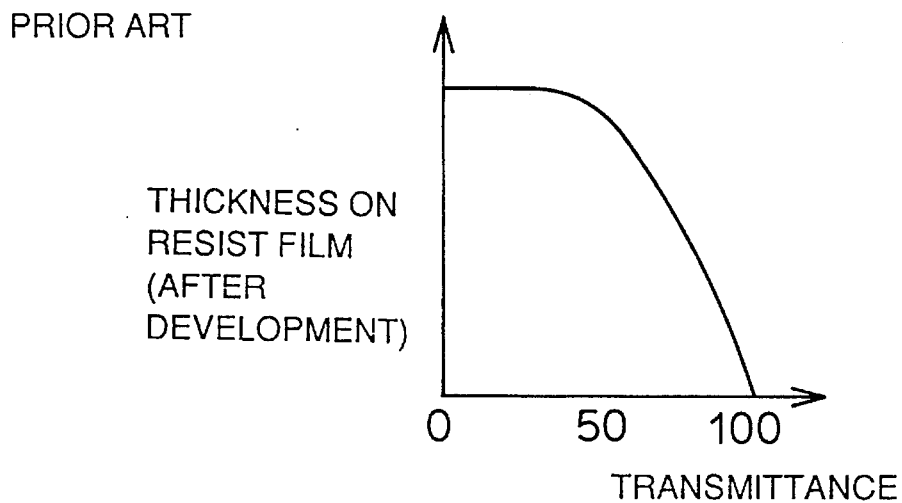
FIG. 23 is a graph showing the relationship between transmittance and the thickness of the resist film after development.
Figure 24:
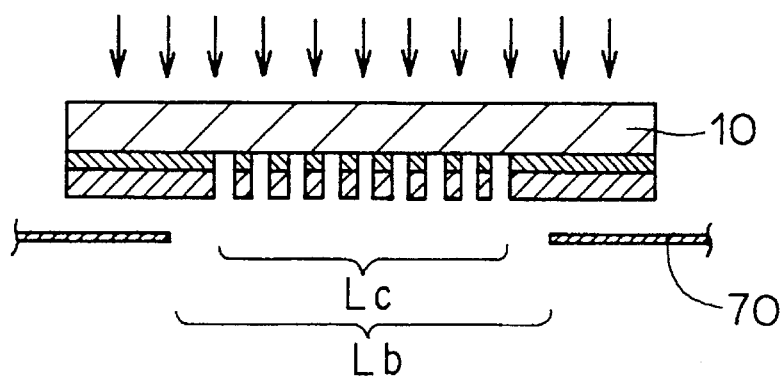
FIG. 24(A) is a cross sectional view showing positions of the conventional attenuating type phase shifting mask and the blind.
FIG. 24(B) shows the electric field of the exposure light directly under the photomask substrate.
FIG. 24(C) shows the intensity of the exposure light on the semiconductor wafer.
FIG. 24(D) shows the state of exposure on the semiconductor wafer.
Figure 24:
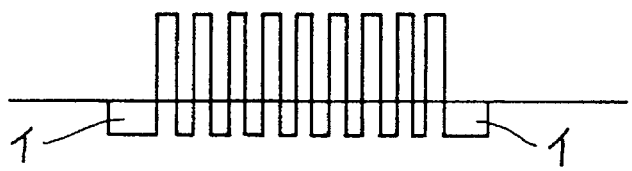
Figure 24:
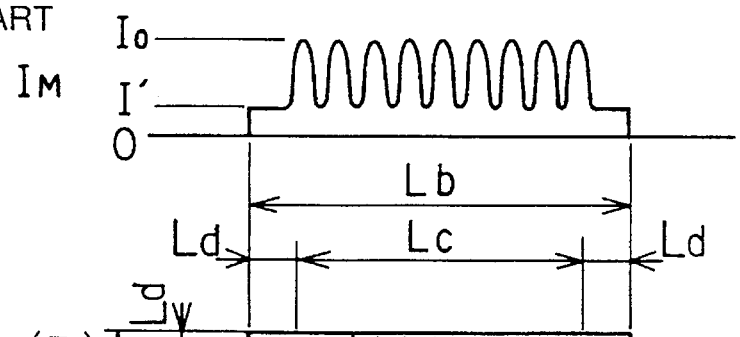
Figure 24:
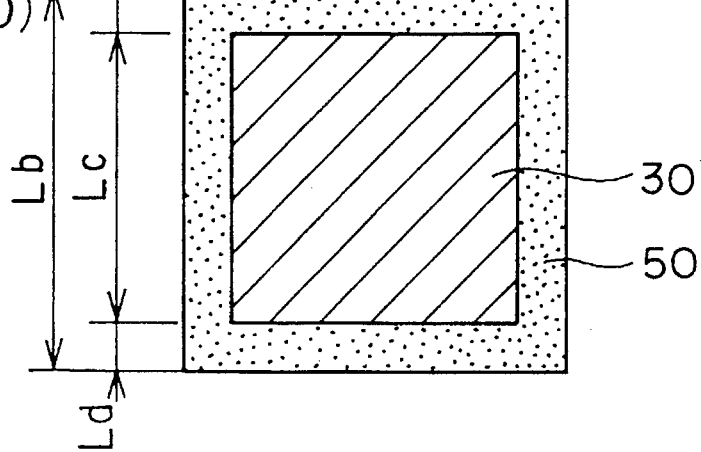
Figure 25:
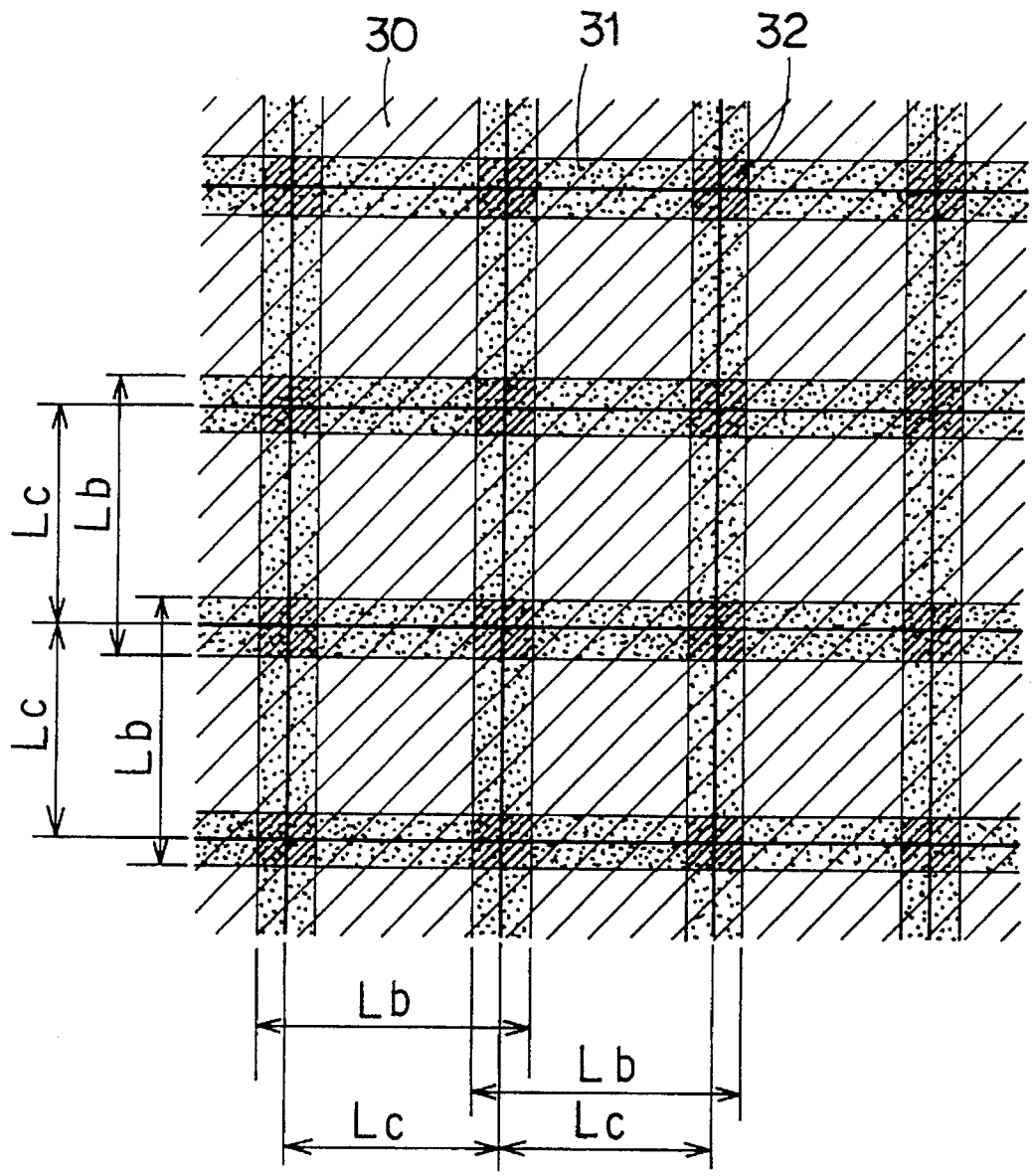
FIG. 25 shows problems encountered when the conventional attenuating type phase shifting mask is used.

In the above-described first and second embodiments, the attenuating type auxiliary phase shifting pattern is provided at the entire periphery of the attenuating type phase shifting pattern. However, if the transmittance of the absorption type shifter film forming the phase shifter is small, for example, 5–8%, exposure of regions other than the desired regions once by the light transmitted through the phase shifter may be acceptable. Thus, when the transmittance of the phase shifter is small, problem arises only at the region 32 shown in FIG. 22.

Accordingly, the attenuating type auxiliary phase shifting pattern are provided only in the vicinity of four corners of the attenuating type phase shifting pattern in the present embodiment.

Figure 13A:
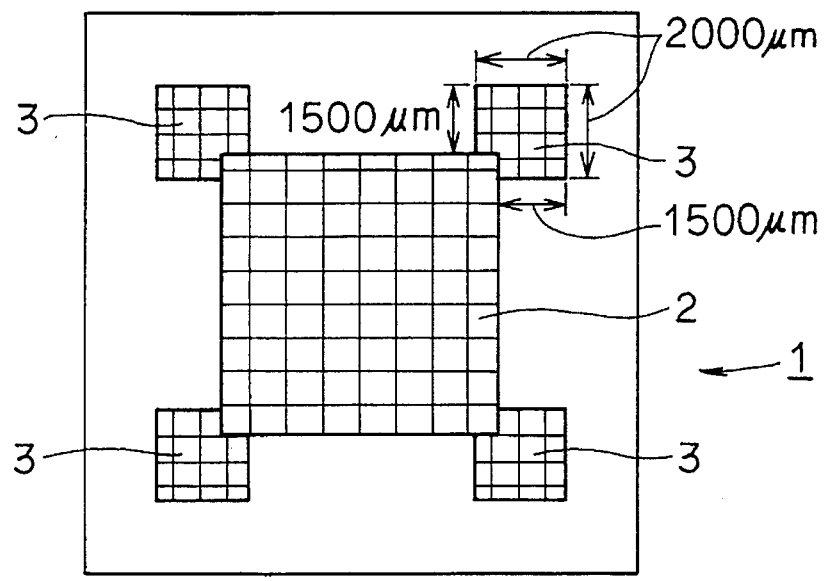
FIG. 13(A) shows an attenuating type phase shifting mask of the third embodiment when viewed from the pattern formation surface.
Figure 13B:
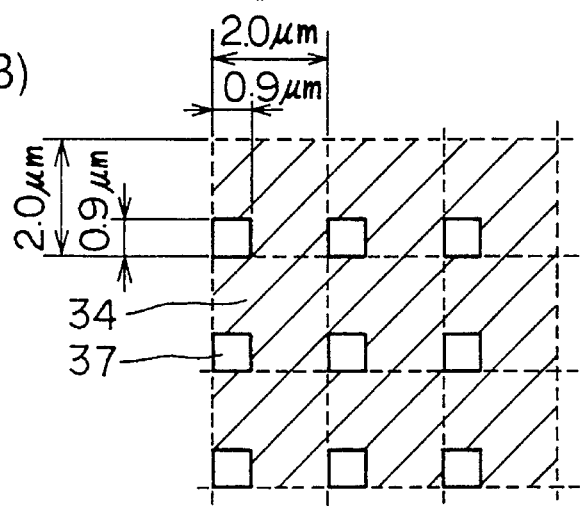
FIG. 13(B) shows patterns of an attenuating type auxiliary phase shifting pattern of the third embodiment.

FIG. 13(A) shows an attenuating type phase shifting mask 1 according to the third embodiment when viewed from the pattern formation surface, where an attenuating type auxiliary phase shifting pattern 3 is provided only in the vicinity of four corners of attenuating type phase shifting pattern 2.

In the present embodiment, the phase shifter of the attenuating type phase shifting pattern is formed of an absorption type shifter film having the transmittance T of 7.5%, and the phase shifter is formed with the length of one side being 2000 μm at each of the four corners of the shifting pattern. In each phase shifter, square patterns having apertures of 0.9 μm×0.9 μm each has the transmitting portion 37 are formed at a pitch of 0.2 μm.

Under the above-mentioned conditions, $S_O/S_H$ equals 0.25, and a equals 0.3 if the transmittance is 7.5% according to FIG. 5, and when we substitute these values, equation (4) would be as follows:

$$0.1771 \geq S_O/S_H \geq 0.38789$$

Since $\sqrt{T}$ is 0.27, equation (4) can be satisfied and also equation (2) can be almost satisfied.

When exposure is carried out utilizing attenuating type phase shifting mask 1 according to the third embodiment, even if the amount of exposure light is four times the most suitable amount of exposure light, reduction of the thickness of the resist film corresponding to four corners of the attenuating type phase shifting pattern is not observed.

The fourth embodiment according to the present invention will be described.

Figure 13C:
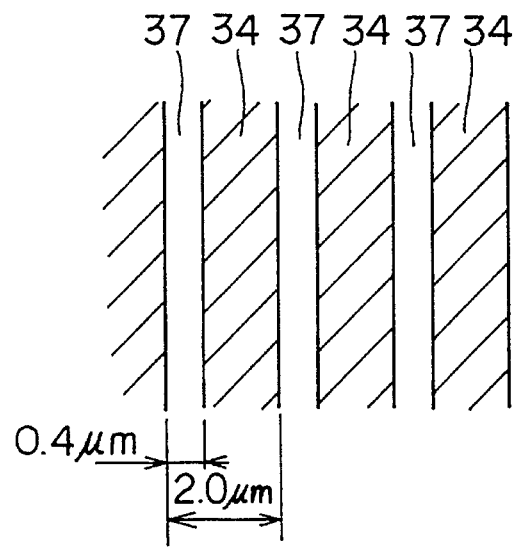
FIG. 13(C) shows patterns of an attenuating type auxiliary phase shifting pattern of the fourth embodiment.

In an attenuating type phase shifting mask 1 according to the fourth embodiment, patterns formed on the attenuating type auxiliary phase shifting pattern in the third embodiment are changed into lines and spaces, as shown in FIG. 13(C), with transmitting portions 37 and phase shifters 34 being linear and arranged alternately. The width of transmitting portion 37 is 0.5 μm and the pitch is 0.2 μm. Since $S_O/S_H$ equals 0.25 satisfying $\sqrt{T}=\sqrt{0.075}=0.27$, equations (2) and (4) can be satisfied.

In the fourth embodiment, similar effect can be obtained as in the third embodiment.

The attenuating type auxiliary phase shift pattern 3 described in the embodiment above includes transmitting portion 37 and phase shifter portion 34 arranged regularly. However, these portions may be arranged irregularly, provided that the condition $S_O/S_H=\sqrt{T}$ is satisfied.

Figure 16:
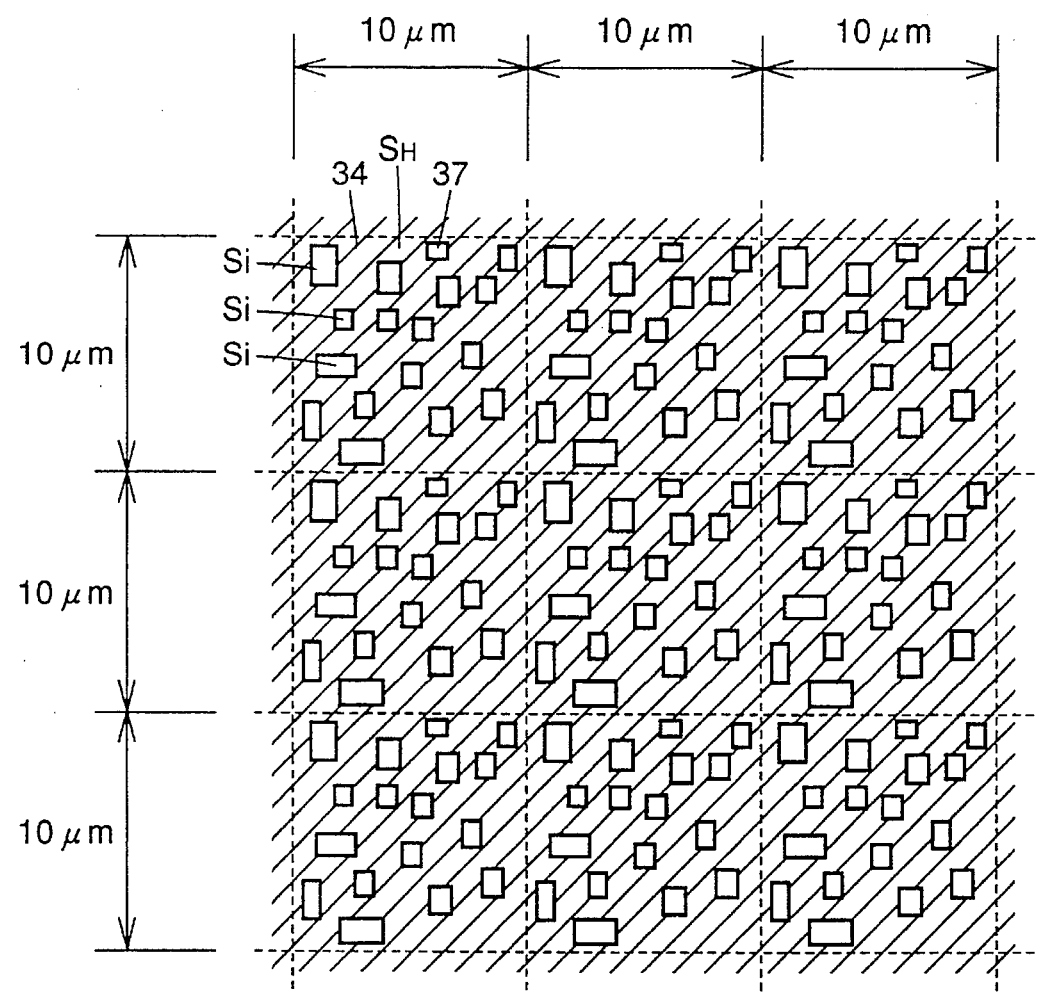
FIG. 16 is a plan view showing the phase shifter portion and the transmitting portion arranged irregularly.

For example, referring to FIG. 16, if an area of 10 μm×10 μm is used as a reference in the attenuating type phase shift pattern area, and the font $(S_O:S_O=\Sigma S_i)$ of planar area $S_H$ of the phase shifter portion 34 and planar area $(S_i)$ of transmitting portion 37 satisfies $S_O/S_H=\sqrt{T}$, similar effects can be obtained even with transmitting portion 37 and phase shifter portion 34 are arranged irregularly. Further, it becomes possible to set direction of light (stray light) scattering at the phase shifter portion at random, releasing degradation of the transfer pattern (chip pattern) closed by light scattering in a specific direction. Here $S_i$ is smaller than the resolution limit of the exposure apparatus. Though an area 10 μm×10 μm is used as a reference, an area of any shape may be used as a reference provided that it is formed in the area in which the attenuating type auxiliary phase shift pattern is formed.

Though a structure of an attenuating type phase shift mask has been described in the embodiment above, in a semiconductor device formed by using the attenuating type phase shift mask used in the embodiments above, the direction of light (stray light) scattering at the phase shifter portion can be set at random and degradation of the transferred pattern caused by light scattering in a specific direction can be prevented. Therefore, even a fine pattern can be manufactured with high quality and high resolution. Further, since defects in the semiconductor device manufactured in this manner is minimized, and thus production yield of the semiconductor device can be improved.

The attenuation type phase shift mask in which transmitting portion 37 and phase shifter portion 34 are arranged at random as shown in FIG. 16 further provides the following effects.

Figure 17:
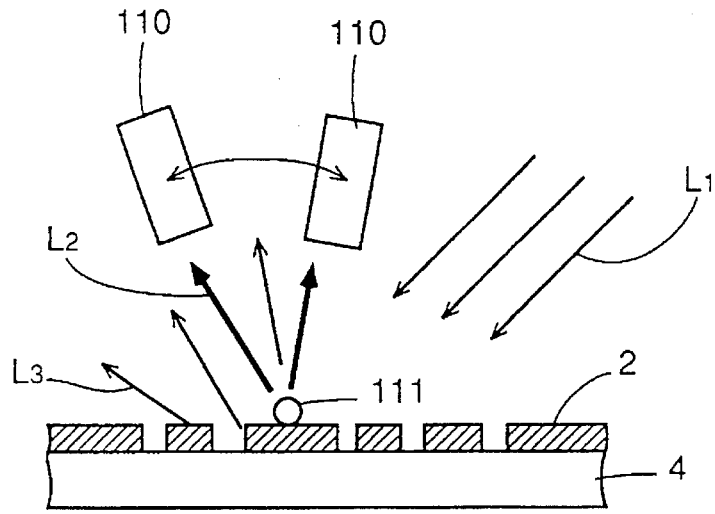
FIGS. 17 to 19 are first to third schematic diagrams showing the state of inspection of the photomask by a particle detector.

Generally, when photomasks are manufactured, delivered and used, the photomasks are inspected by using a particle detector shown in FIG. 17, so as to see if there is a particle on the mask. The particle detector detects, by means of several photodetectors 110, light (scattered light) which is reflection of the light $L_1$ incident on the mask, and determines whether the reflected light is the reflected light $L_2$ from substrate 4 and mask pattern 2, or reflected light $L_3$ from a particle 111. In this detection, the fact that intensity of light $L_3$ reflected from particle 111 is stronger than the intensity of light reflected from other portions is utilized.

Figure 18:
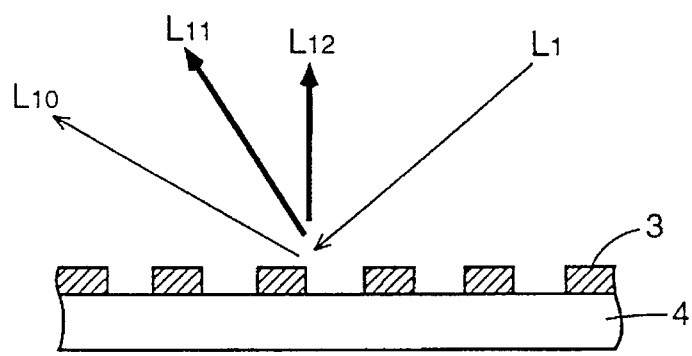

When the attenuation type auxiliary pattern in which transmitting portion 37 and phase shifter portion 34 are arranged regularly at a prescribed space such as shown in FIGS. 2 and 12 are inspected by using the particle detector, the light $L_1$ incident on the particle detector is diffracted in a prescribed direction as shown in FIG. 18. Therefore, the diffraction light (0th order diffraction light $L_{10}$, first order diffraction light $L_{11}$ and second order diffraction light $L_{12}$) of the incident light $L_1$ comes to have high intensity. As a result, when the diffraction light $L_{10}$, $L_{11}$ and $L_{12}$ should enter the photodetector, it becomes difficult to distinguish the diffraction light from the light reflected from the particle, resulting in error in detection by the particle detector. When the sensitivity of the particle detector is set low in order to prevent such erroneous detection, particle (of the size of 0.5 μm to 1.0 μm, for example) to be detected may possibly be missed.

Figure 19:
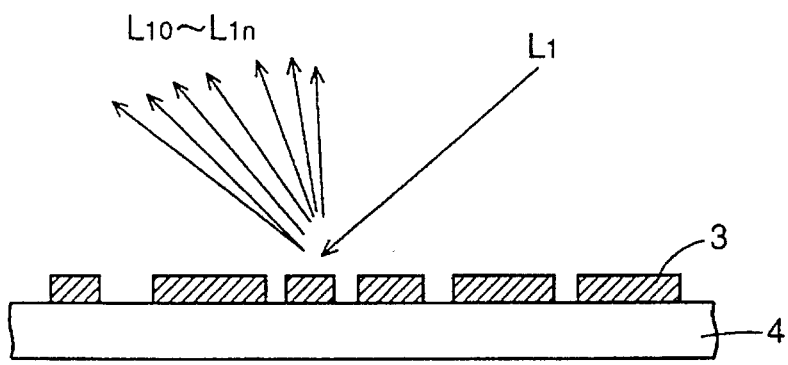

By contrast, in the inspection of the attenuation type auxiliary phase shift pattern in which transmitting portion 37 and phase shifter portion 34 are arranged at random as shown in FIG. 16, the incident light $L_1$ is scattered at random into diffraction light ($L_{10}$ to $L_{1n}$) of low intensity, as shown in FIG. 19. Therefore, the phase shifter portion 34 may not be erroneously detected as the particle by the particle detector, and it is not necessary to set sensitivity of the particle detector low.

Figure 14:
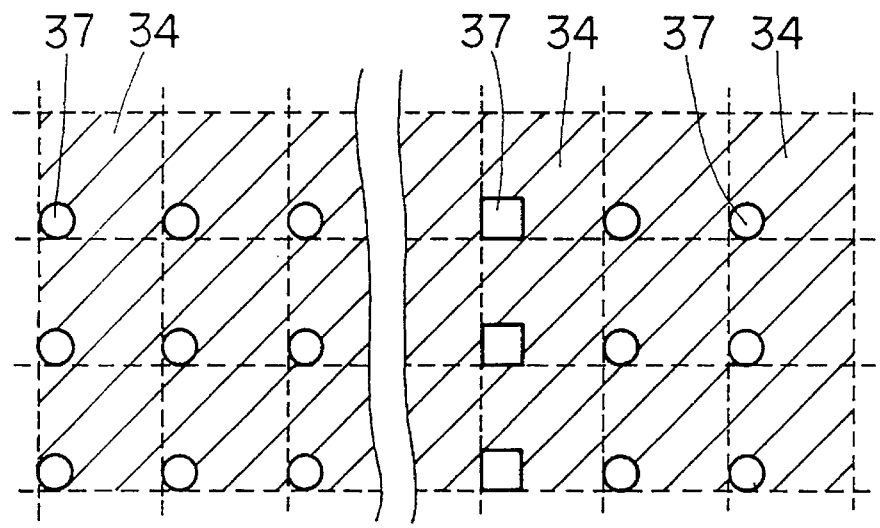
FIG. 14 is a first view illustrating a problem occurred in respective embodiments.
Figure 15:
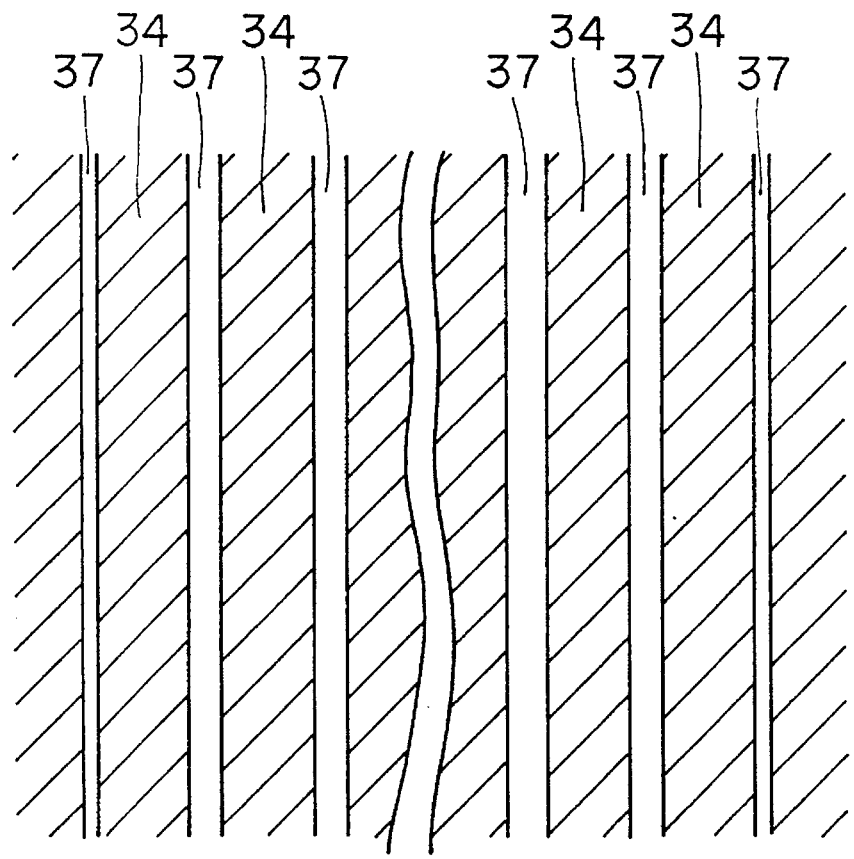
FIG. 15 is a second view illustrating a problem occurred in respective embodiments.

In the above-described embodiment, dimensions of the peripheral pattern of the exposure region sometimes become smaller as shown in FIG. 14 or narrower as shown in FIG. 15 during exposure of the attenuating type auxiliary phase shifting pattern. This is because the amount of electron beams directed to the peripheral pattern portion of the exposure region is insufficient due to the proximity effect of exposure using electron beams.

In order to avoid such a problem, a dimensional bias (+0.1–0.3) is added to the data of the electron beam exposure at the time of exposing the peripheral pattern with electron beams.

Rectangular and linear shapes have been employed for the attenuating type phase shifting pattern, but circular or polygonal shapes may be utilized to achieve a similar function and effect as long as those shapes satisfy $S_O/S_H$ nearly equal $\sqrt{T}$.

Although the attenuating type auxiliary phase shifting pattern has been provided at the periphery of the chip in the above embodiment, the attenuating type auxiliary phase shifting pattern may be provided within the chip if the light shielding portion is necessary, by applying the similar method.

The exposure method utilizing the attenuating type phase shifting mask according to the above-described embodiments can be utilized effectively in the manufacturing process of DRAM, SRAM, flash memory, ASIC, microcomputer, and a semiconductor device such as GaAs of 4M, 16M, 64M, or 256M. Further, such a method is sufficiently applicable to a semiconductor device or a manufacturing process of a liquid crystal display.

According to the attenuating type phase shifting mask of the present invention, beams of light transmitting through the attenuating type auxiliary phase shifting pattern do not form any images on the semiconductor wafer since the pattern is smaller than the limit of resolution. Since beams of light transmitted through the transmitting portion and beams of light transmitted through the phase shifter overlap with each other and the phase of the light transmitted through the phase shifter is reversed, those beams of light are canceled with each other, whereby the light intensity on the semiconductor wafer can be reduced. Also, it is possible to set direction of light (stray light) scattering at the phase shifter portion at random, and to reduce degradation of the transferred pattern (chip pattern) caused by the light scattering in a specific direction.

Further, in the semiconductor device manufactured by using the attenuating type phase shifting mask in accordance with the present invention, the direction of light (stray light) scattering at the phase shift portion can be made at random, and degradation of the transferred pattern caused by the light scattering in a specific direction can be prevented, and therefore even a fine pattern can be formed with high quality and high resolution, and thus semiconductor device having superior quality can be manufactured.

Therefore, exposure of the portion other than the exposure region is prevented, the quality of exposure at the time of manufacturing the semiconductor device is improved, and the yield of manufacturing the semiconductor device can be improved.

Also, by setting values of planar area ($S_O$) of the transmitting portion, and planar area ($S_H$) of the phase shifter, and transmittance (T) of the phase shifter of the attenuating type auxiliary phase shifting pattern to predetermined values it becomes possible to control the light intensity on the semiconductor wafer by adjusting the intensity of the light transmitting through the phase shifter and the intensity of the light transmitting through the transmitting portion.

On the other hand, by setting $S_O/S_H$ which is a ratio of planar area ($S_O$) of the transmitting portion to planar area ($S_H$) of the phase shifter of the attenuating type auxiliary phase shifting pattern, to be approximately equal to the value of $\sqrt{T}$ of transmittance (T) of the phase shifter, the light intensity on the semiconductor wafer can be controlled to be not more than 3% of the light intensity before transmitting through the pattern.

Further, the auxiliary phase shifting pattern is provided at the entire periphery of the attenuating type phase shifting pattern. Thus, even if a plurality of portions are exposed successively utilizing the attenuating type phase shifting mask, other regions are not exposed so that satisfactory exposure can be carried out.

Further, the auxiliary phase shifting patterns are provided only in the vicinity of four corners of the attenuating type phase shifting pattern having a rectangular shape.

Thus, when exposure is carried out successively in order on the semiconductor wafer utilizing the attenuating type phase shifting pattern, any region is not exposed more than once by the light transmitting through the periphery of the attenuating type phase shifting pattern, so that satisfactory exposure can be carried out.

The shape of patterns having apertures in the transmitting portion formed on the attenuating type auxiliary phase shifting pattern is rectangular. Thus, adhesive property of the phase shifting pattern to the photomask substrate is improved so that the attenuating type phase shifting mask having a highly reliable structure can be provided.

The transmitting portions and the phase shifters formed on the attenuating type phase shifting pattern are linear and arranged alternately. Thus, the attenuating type auxiliary phase shifting pattern can be formed easily so as to facilitate manufacturing of the attenuating type phase shift mask.

According to a method of manufacturing an attenuating type phase shifting mask, any images cannot be formed on a semiconductor wafer by the light transmitted through an attenuating type auxiliary phase shifting pattern because the resolution of the pattern is smaller than the limit of resolution of the exposure apparatus. Further, since beams of light transmitted through a transmitting portion and beams of light transmitted through a phase shifter portion overlap with each other and are in reverse phases, those beams of light cancel with each other due to interference, whereby the light intensity on the semiconductor wafer can be reduced. This prevents exposure of portions other than exposure region during conducting exposure, improves exposure state during manufacturing of a semiconductor device, and further improves a yield of manufacturing of the semiconductor device.

More preferably, forming the attenuating type phase shifter film includes the step of forming a film of a kind selected from a group comprising chromium oxide, chromium nitride oxide, nitride carbide oxide of chromium, molybdenum silicide oxide, and nitride oxide of molybdenum silicide.

Thus, the number of manufacturing steps of the attenuating type phase shifting mask can be reduced because the attenuating type phase shifter film is formed of one kind of film, so that the manufacturing cost of the attenuating type phase shifting mask can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An attenuating phase shifting mask, comprising:

attenuating phase shifting pattern formed at a predetermined position on a photomask substrate; and attenuating auxiliary phase shifting pattern including a transmitting portion and a phase shifter formed at a predetermined position at the periphery of said attenuating phase shifting pattern, said attenuating auxiliary phase shifting pattern having a pattern smaller than the limit of resolution of the exposure apparatus, and said transmitting portion and said phase shifter being arranged irregularly.

2. The attenuating phase shifting mask according to claim 1, wherein in said attenuating auxiliary phase shifting pattern, values of planar area of said transmitting portion, planar area of said phase shifter, and transmittance of said phase shifter are set such that the substantial light transmitting through said transmitting portion and the light intensity on the exposed material of the light transmitting through said phase shifter being canceled with each other is not more than 3% of the light intensity before transmitting through said transmitting portion and said phase shifter.

3. The attenuating phase shifting mask according to claim 2, wherein ratio of planar area of said transmitting portion to planar area of said phase shifter represented as $S_O/S_H$ of said attenuating auxiliary phase shifting pattern is approximately equal to a value $\sqrt{T}$ of transmittance of said phase shifter.

4. The attenuating phase shifting mask according to claim 1, wherein said attenuating type auxiliary phase shifting pattern is provided at the entire periphery of said attenuating phase shifting pattern.

5. The attenuating type phase shifting mask according to claim 1, wherein the shape of said attenuating type phase shifting pattern is rectangular, and said attenuating type auxiliary phase shifting pattern is provided in the vicinity of four corners of said attenuating type phase shifting pattern.

6. The attenuating type phase shifting mask according to claim 1, wherein the planar shape of said transmitting portion of said attenuating type auxiliary phase shifting pattern is rectangular.

7. The attenuating phase shifting mask according to claim 1, wherein said transmitting portion and said phase shifter of said attenuating auxiliary phase shifting pattern are linear and arranged alternately.

8. A method of manufacturing an attenuating phase shifting mask, comprising the steps of:

forming an attenuating phase shifter film having a light transmittance of 5–20% on a transparent substrate for shifting a phase of a transmitted light by 180°;

forming on said attenuating phase shifter film a resist film including an attenuating phase shifting pattern region and an attenuating auxiliary phase shifting pattern region formed at a predetermined position at the periphery of the attenuating phase shifting pattern region; and patterning said attenuating phase shifter film by etching using said resist film as a mask; wherein said attenuating auxiliary phase shifting pattern region includes a pattern having a resolution smaller than a limit of resolution of an exposure apparatus, and said transmitting portion and said phase shifter being arranged irregularly.

9. A method of manufacturing an attenuating phase shifting mask according to claim 8, wherein said step of forming the attenuating phase shifter film includes the steps of:
    forming a semi-light shielding film having a light transmittance of 5–20%; and
    forming a phase shifter film shifting a phase of transmitted light by 180°.

10. A method of manufacturing an attenuating phase shifting mask according to claim 9, wherein said step of forming the semi-light shielding film includes the step of forming a chromium film, and said step of forming the phase shifter film includes the step of forming a silicon oxide film.

11. A method of manufacturing an attenuating phase shifting mask according to claim 8, wherein said step of forming the attenuating phase shifter film includes the step of
    forming a film of a kind selected from a group comprising chromium oxide, chromium nitride oxide, nitride carbide oxide of chromium, molybdenum silicide oxide, and nitride oxide of molybdenum silicide.

12. A semiconductor device formed by using an attenuating phase shifting mask, including: an attenuating phase shifting pattern formed at a predetermined position on a photomask substrate; and an attenuating auxiliary phase shifting pattern including a transmitting portion and a phase shifter formed at a predetermined position at the periphery of said attenuating phase shifting pattern; said attenuating auxiliary phase shifting pattern having a pattern smaller than the limit of resolution of the exposure apparatus, and said transmitting portion and said phase shifter being arranged irregularly.

* * * * *